US012684992B2

(12) United States Patent
Li

(10) Patent No.: US 12,684,992 B2
(45) Date of Patent: Jul. 14, 2026

(54) LIGHT-EMITTING TRANSISTOR AND DISPLAY SUBSTRATE

(71) Applicants:Beijing BOE Technology Development Co., Ltd., Beijing (CN); BOE Technology Group Co., Ltd., Beijing (CN)

(72) Inventor: Dong Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 463 days.

(21) Appl. No.: 18/270,918

(22) PCT Filed: Feb. 26, 2021

(86) PCT No.: PCT/CN2021/078087
§ 371 (c)(1),
(2) Date: Jul. 5, 2023

(87) PCT Pub. No.: WO2022/178810
PCT Pub. Date: Sep. 1, 2022

(65) Prior Publication Data
US 2024/0057441 A1      Feb. 15, 2024

(51) Int. Cl.
*H10K 59/82* (2023.01)
*H10K 50/30* (2023.01)
(52) U.S. Cl.
CPC ............. *H10K 59/82* (2023.02); *H10K 50/30* (2023.02)

(58) Field of Classification Search
CPC ...... H10K 59/82; H10K 50/30; H10K 50/115; H10K 59/1213; H10K 59/1216; H10K 59/123
See application file for complete search history.

(56) References Cited

U.S. PATENT DOCUMENTS

2002/0167280 A1* 11/2002 Hayashi ............... H10K 50/805
315/169.3
2009/0135105 A1     5/2009 Nakamura et al.
(Continued)

FOREIGN PATENT DOCUMENTS

CN       1386039  A    12/2002
CN     105206641  A    12/2015
(Continued)

OTHER PUBLICATIONS

International Search Report and Written Opinion in PCT/CN2021/ 078087, mailed Nov. 25, 2021, 7 pages.
(Continued)

*Primary Examiner* — Chad M Dicke
*Assistant Examiner* — Jeremy Daniel Watts
(74) *Attorney, Agent, or Firm* — ArentFox Schiff LLP; Michael Fainberg

(57) ABSTRACT

The present disclosure provides a light-emitting transistor and a display substrate. The display substrate includes a plurality of pixel circuits. Each pixel circuit uses a light-emitting transistor that integrates a control transistor and a quantum dot light-emitting device in the same device, and the light-emitting transistor can simultaneously realize the functions of switch controlling and light-emitting display.

20 Claims, 7 Drawing Sheets

(56)        References Cited

U.S. PATENT DOCUMENTS

| | | | |
|---|---|---|---|
| 2013/0240842 A1* | 9/2013 | Rinzler | H10K 50/30 |
| | | | 257/329 |
| 2017/0250238 A1* | 8/2017 | Muccini | H10K 59/1213 |
| 2018/0019371 A1* | 1/2018 | Steckel | C09K 11/883 |
| 2018/0358568 A1* | 12/2018 | Luan | H10K 50/30 |
| 2024/0090262 A1* | 3/2024 | Katsui | H10K 59/1201 |
| 2024/0224576 A1* | 7/2024 | Yan | H10K 59/00 |

FOREIGN PATENT DOCUMENTS

| | | | |
|---|---|---|---|
| CN | 105304830 A | 2/2016 |
| CN | 106601920 A | 4/2017 |
| CN | 108987600 A | 12/2018 |
| CN | 110880556 A | 3/2020 |
| CN | 111081740 A | 4/2020 |
| CN | 111146351 A | 5/2020 |
| CN | 111370587 A | 7/2020 |
| KR | 101339385 B1 | 12/2013 |

OTHER PUBLICATIONS

Chen et al. "High-Performance Quantum-Dot Light-Emitting Transistors Based on Vertical Organic Thin-Film Transistors", ACS Applied Materials and Interfaces, downloaded on Sep. 24, 2019.

\* cited by examiner

LIGHT-EMITTING TRANSISTOR AND DISPLAY SUBSTRATE

CROSS-REFERENCE TO RELATED APPLICATIONS

The disclosure is a National Stage of International Application No. PCT/CN2021/078087, filed on Feb. 26, 2021, which is hereby incorporated by reference in their entireties.

TECHNICAL FIELD

The present disclosure relates to the technical field of display, and in particular to a light-emitting transistor and a display substrate.

BACKGROUND

Quantum dots (QDs), as a type of novel light-emitting material, have the advantages of high light color purity, high photoluminescence quantum yield, adjustable light-emitting colors, long service life, etc., thereby becoming the emerging research focus of novel light-emitting diode (LED) luminescent materials. Therefore, research on light-emitting devices using quantum dot materials as the light-emitting layer has become a prevailing trend of research on novel display devices.

An active-matrix quantum dot light-emitting display (AMQLED) panel has also received increasing attention due to its potential advantages in wide color gamut and long lifetime. As the research keeps deepening, the quantum efficiency keeps increasing and substantially reaches the level of industrialization. So a trend towards further industrialization with new processes and technologies will be inescapable in future.

In mass production, a driving backplane of a quantum dot light-emitting display (QLED) panel typically adopts a thin-film transistor (TFT) backplane as a control circuit of the light-emitting device. The TFT may occupy a certain position in the sub-pixel, thus compressing a light-emitting area of the light-emitting device and affecting an aperture ratio of the light-emitting device.

SUMMARY

An embodiment of the present disclosure provides a light-emitting transistor, including:

a substrate;

a gate on the substrate;

an insulating layer on a side, facing away from the substrate, of the gate;

an active layer on a side, facing away from the gate, of the insulating layer;

first electrodes on a side, facing away from the insulating layer, of the active layer, where the first electrodes have set patterns;

a quantum dot light-emitting layer on a side, facing away from the active layer, of the first electrode; where the quantum dot light-emitting layer is filled between the set patterns of the first electrodes and comes into contact with the active layer; and a second electrode on a side, facing away from the first electrode, of the quantum dot light-emitting layer.

In a possible implementation mode, according to the light-emitting transistor provided in the embodiment of the present disclosure, the set pattern of the first electrode is a comb pattern or a grid pattern.

In a possible implementation mode, according to the light-emitting transistor provided in the embodiment of the present disclosure, the second electrode is arranged on an entire surface, and an orthographic projection of the second electrode on the substrate completely covers orthographic projections of the first electrodes on the substrate.

In a possible implementation mode, the light-emitting transistor provided in the embodiment of the present disclosure further includes an electron transport layer, where the active layer includes an N-type semiconductor material, and the electron transport layer and the active layer have an integral structure.

In a possible implementation mode, the light-emitting transistor provided in the embodiment of the present disclosure further includes at least one of a hole injection layer or a hole transport layer between the quantum dot light-emitting layer and the second electrode.

In a possible implementation mode, the light-emitting transistor provided in the embodiment of the present disclosure further includes a hole transport layer, where the active layer includes a P-type semiconductor material, and the hole transport layer and the active layer have an integral structure.

In a possible implementation mode, the light-emitting transistor provided in the embodiment of the present disclosure further includes at least one of an electron injection layer or an electron transport layer between the quantum dot light-emitting layer and the second electrode.

In another aspect, an embodiment of the present disclosure further provides a display substrate, including a plurality of pixel circuits, where each pixel circuit includes:

a switch transistor, where a gate of the switch transistor is coupled to a scanning signal end, and a first electrode of the switch transistor is coupled to a data signal end;

the light-emitting transistor provided in the embodiments of the present disclosure, where a gate of the light-emitting transistor is coupled to a second electrode of the switch transistor, a first electrode of the light-emitting transistor is coupled to a first power source signal end, and a second electrode of the light-emitting transistor is coupled to a second power source signal end; and a capacitor, where the capacitor is coupled between the first electrode and the gate of the light-emitting transistor.

In a possible implementation mode, according to the display substrate provided in the embodiment of the present disclosure, the first power source signal end is grounded.

In a possible implementation mode, according to the display substrate provided in the embodiment of the present disclosure, the active layer of the light-emitting transistor includes an N-type semiconductor material, and the second power source signal end is configured to load a positive voltage signal.

In a possible implementation mode, according to the display substrate provided in the embodiment of the present disclosure, an active layer of the light-emitting transistor includes a P-type semiconductor material, and the second power source signal end is configured to load a negative voltage signal.

In another aspect, an embodiment of the present disclosure further provides another display substrate, including a plurality of pixel circuits, where each pixel circuit includes:

a switch transistor, where a gate of the switch transistor is coupled to a scanning signal end, and a first electrode of the switch transistor is coupled to a data signal end;

a light-emitting transistor including a gate, an insulating
layer, first electrodes, an active layer, a quantum dot
light-emitting layer and a second electrode that are
sequentially stacked; where the first electrodes have set
patterns, and the active layer is filled between the set
patterns of the first electrodes and comes into contact
with the insulating layer; and the gate of the light-
emitting transistor is coupled to a second electrode of
the switch transistor, the first electrode of the light-
emitting transistor is coupled to a first power source
signal end, and the second electrode of the light-
emitting transistor is coupled to a second power source
signal end; and a capacitor, where the capacitor is coupled between the
first electrode and the gate of the light-emitting tran-
sistor.

In a possible implementation mode, according to the
display substrate provided in the embodiment of the present
disclosure, the set pattern of the first electrode of the
light-emitting transistor is a comb pattern or a grid pattern.

In a possible implementation mode, according to the
display substrate provided in the embodiment of the present
disclosure, the second electrode of the light-emitting tran-
sistor is arranged on an entire surface, and an orthographic
projection of the second electrode of the light-emitting
transistor on the substrate completely covers orthographic
projections of the first electrodes of the light-emitting tran-
sistor on the substrate.

In a possible implementation mode, according to the
display substrate provided in the embodiment of the present
disclosure, the gate of the switch transistor, the gate of the
light-emitting transistor, and a first electrode of the capacitor
are arranged on the same layer;

the first electrode and the second electrode of the switch
transistor, the first electrodes of the light-emitting tran-
sistor and a second electrode of the capacitor are
arranged on the same layer; and the second electrode of the light-emitting transistor is
electrically connected to the second electrode of the
capacitor.

In a possible implementation mode, according to the
display substrate provided in the embodiment of the present
disclosure, the light-emitting transistor further includes an
electron transport layer, the active layer of the light-emitting
transistor includes an N-type semiconductor material, and
the electron transport layer and the active layer of the
light-emitting transistor have an integral structure.

In a possible implementation mode, according to the
display substrate provided in the embodiment of the present
disclosure, the first power source signal end is grounded, and
the second power source signal end is configured to load a
positive voltage signal.

In a possible implementation mode, according to the
display substrate provided in the embodiment of the present
disclosure, the light-emitting transistor further includes at
least one of a hole injection layer or a hole transport layer
between the quantum dot light-emitting layer and the second
electrode of the light-emitting transistor.

In a possible implementation mode, according to the
display substrate provided in the embodiment of the present
disclosure, the light-emitting transistor further includes a
hole transport layer, the active layer of the light-emitting
transistor includes a P-type semiconductor material, and the
hole transport layer and the active layer of the light-emitting
transistor have an integral structure.

In a possible implementation mode, according to the
display substrate provided in the embodiment of the present disclosure, the first power source signal end is grounded, and
the second power source signal end is configured to load a
negative voltage signal.

In a possible implementation mode, according to the
display substrate provided in the embodiment of the present
disclosure, the light-emitting transistor further includes at
least one of an electron injection layer or an electron
transport layer between the quantum dot light-emitting layer
and the second electrode of the light-emitting transistor.

DETAILED DESCRIPTION

In order to make objectives, technical solutions, and
advantages of the present disclosure clearer, the present
disclosure will be further described below in conjunction
with the accompanying drawings in detail. Apparently, the
described embodiments are some embodiments rather than
all embodiments of the present disclosure. Based on the
embodiments of the present disclosure, all other embodi-
ments acquired by those of ordinary skill in the art without
making creative efforts fall within the scope of protection of
the present disclosure.

Shapes and sizes of components in the accompanying
drawings do not reflect true scale, and are merely illustrative
of the present disclosure.

Figure 1:
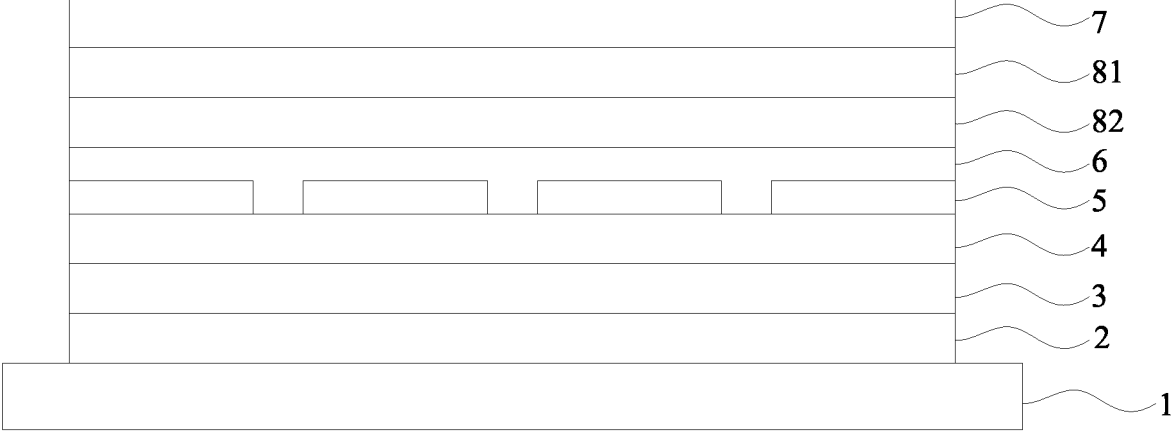
FIG. 1 is a schematic structural diagram of a light-
emitting transistor according to some embodiments of the
present disclosure.
Figure 2:
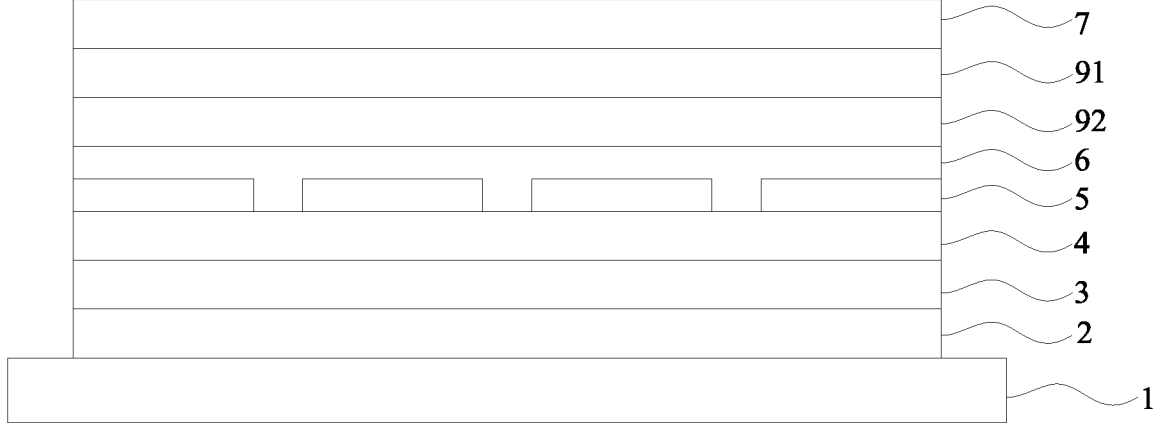
FIG. 2 is another schematic structural diagram of a
light-emitting transistor according to some embodiments of
the present disclosure.

Some embodiments of the present disclosure provide a
light-emitting transistor, as shown in FIGS. 1 and 2 and
including:

a substrate 1;

a gate 2 on the substrate 1;

an insulating layer 3 on a side, facing away from the substrate 1, of the gate 2;

an active layer 4 on a side, facing away from the gate 2, of the insulating layer 3;

first electrodes 5 on a side, facing away from the insulating layer 3, of the active layer 4, where the first electrodes 5 have set patterns;

a quantum dot light-emitting layer 6 on a side, facing away from the active layer 4, of the first electrodes 5; where the quantum dot light-emitting layer 6 is filled between the set patterns of the first electrodes 5 and comes into contact with the active layer 4; and a second electrode 7 on a side, facing away from the first electrode 5, of the quantum dot light-emitting layer 6.

Specifically, the light-emitting transistor provided in some embodiments of the present disclosure integrates a control transistor and a quantum dot light-emitting device in the same device, to simultaneously achieve functions of switch control and light-emitting display. When the light-emitting transistor is applied to a pixel circuit, a circuit structure can be simplified, an area occupied by the device can be effectively reduced, and an aperture ratio of the device can be improved.

Specifically, in the light-emitting transistor provided in some embodiments of the present disclosure, the substrate 1 serves as a support element for providing support for layers on the substrate. The substrate 1 may be a glass substrate, a silicon substrate or a flexible substrate; and the material of the flexible substrate may be, for example, polyethylene terephthalate (PET), polyethylene naphthalate (PEN), poly-imide (PI), etc. It can be understood that a buffer layer, etc. may be arranged between the substrate 1 and the gate 2. The buffer layer may specifically include a suitable material of materials, such as PET, PEN, polyacrylate and/or polyimide, in a layered structure in a form of a single layer or a stack of a plurality of layers. The buffer layer may also be formed of a silicon oxide material or a silicon nitride material, or may include a composite layer of an organic material and/or an inorganic material.

Specifically, in the light-emitting transistor provided in some embodiments of the present disclosure, the gate 2 is located on the substrate 1, and the gate 2 may be a transparent electrode, such as an indium tin oxide (ITO) or a metal electrode, such as Al, Ag, Au, Pt, Mo, etc.

Specifically, in the light-emitting transistor provided in some embodiments of the present disclosure, the insulating layer 3 is located on the gate 2, and the insulating layer 3 may be an inorganic oxide insulating layer or an organic polymer insulating layer. The material of the inorganic oxide insulating layer may be $SiO_2$, $Al_2O_3$, $ZrO_2$, etc. The material of the organic polymer insulating layer may be polymethyl methacrylate (PMMA), PVDF-TrFE, PVDF-TrFE-CtFE, polyvinyl pyrrolidone (PVP), etc.

Figure 3:
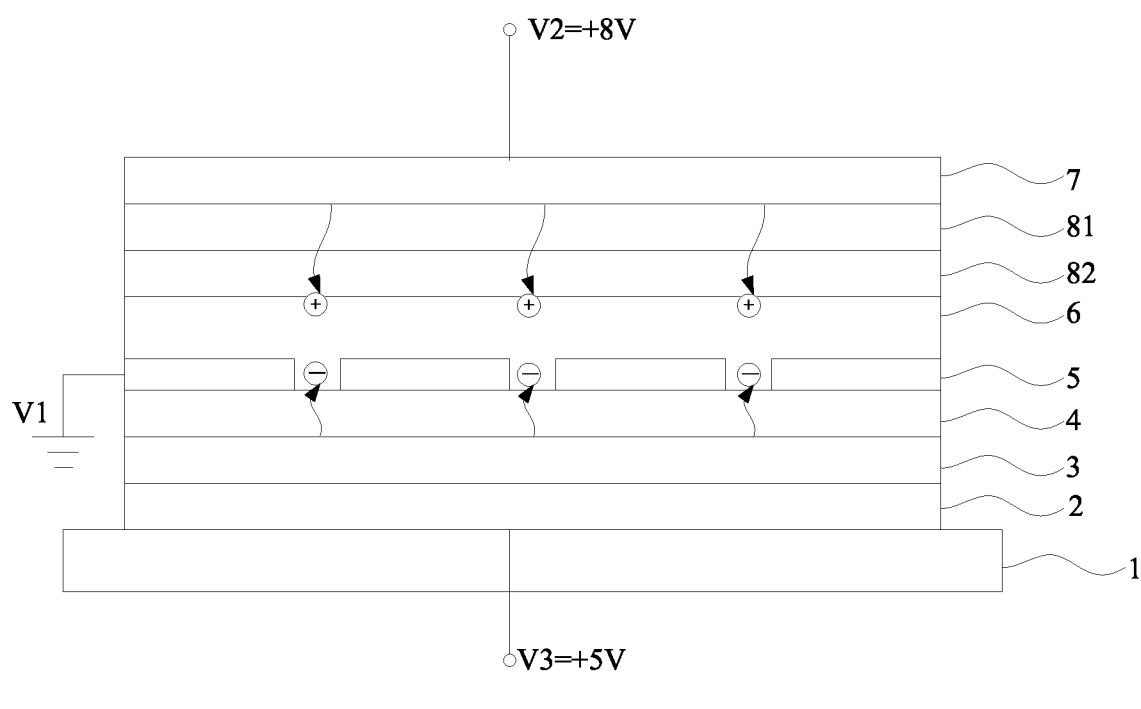
FIG. 3 is a schematic diagram of a principle of a light-
emitting transistor according to some embodiments of the
present disclosure.

Specifically, in the light-emitting transistor provided in some embodiments of the present disclosure, the active layer 4 is located on the insulating layer 3. Optionally, as shown in FIGS. 1 and 3, the active layer 4 may include an N-type semiconductor material, specifically, an oxide semiconductor such as indium gallium zinc oxide (IGZO), indium tin oxide (IZO), indium zinc tin oxide (IZTO), gallium tin oxide (GTO), etc., and an organic semiconductor such as [6,6]-phenyl-C61-butyric acid methyl ester (PCBM), C60, etc. In this case, the light-emitting transistor may further include an electron transport layer; and the active layer 4 also serves as the electron transport layer and has the performance of transporting electrons, that is, the electron transport layer and the active layer have an integral structure. Moreover, an energy level of the selected N-type semiconductor material needs to match an energy level of a material of the quantum dot light-emitting layer 6. An energy level of a conduction band minimum (CBM) of the active layer 4 of the N-type semiconductor material is approximately ranges from −3.8 eV to −4.2 eV.

Figure 4:
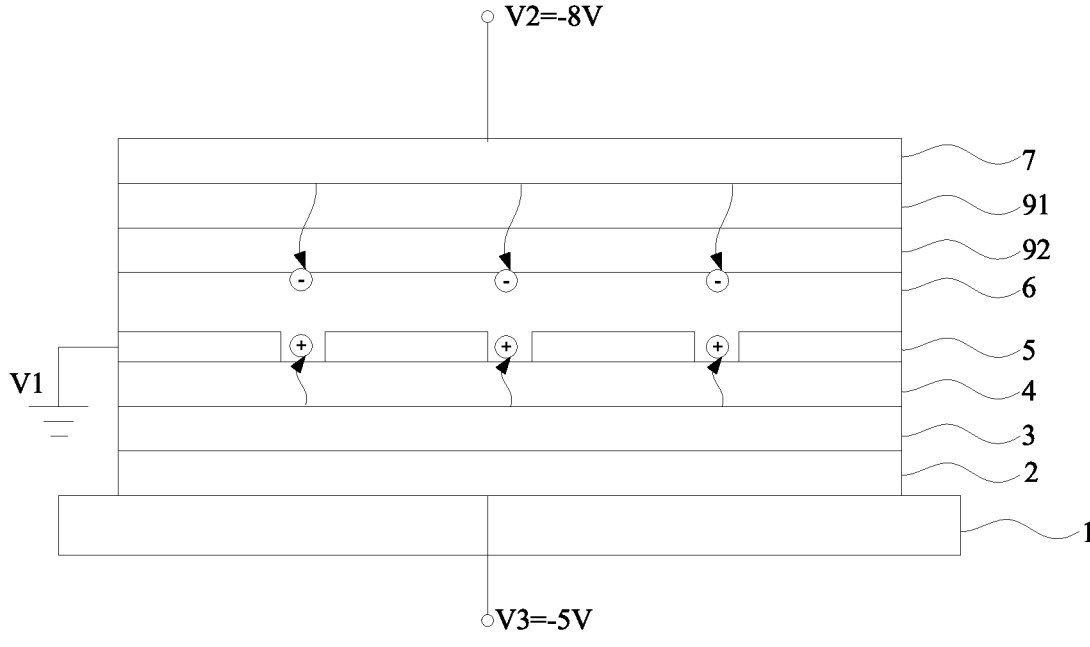
FIG. 4 is a schematic diagram of another principle of a
light-emitting transistor according to some embodiments of
the present disclosure.

Optionally, in the light-emitting transistor provided in some other embodiments of the present disclosure, as shown in FIGS. 2 and 4, the active layer 4 may include a P-type semiconductor material, specifically, may be a small mol-ecule semiconductor such as 2,7-Dioctyl[1]benzothieno[3, 2-b][1]benzothiophene (C8-BTBT), Pentacene, dinaphtho [2,3-b:2',3'-f]thieno[3,2-b]thiophene (DNTT), poly(9,9-dioctylfluorene-alt-bithiophene) (F8T2), etc., may be a polymer semiconductor such as poly(3-hexylthiophene-2,5-diyl) (P3HT), DPP-TT, etc., or may be an inorganic semi-conductor material such as low temperature poly-silicon (LTPS). In this case, the light-emitting transistor may further include a hole transport layer; and the active layer 4 also serves as the hole transport layer and has the performance of transporting holes, that is, the hole transport layer and the active layer have an integrated structure. Moreover, an energy level of the selected P-type semiconductor material needs to match an energy level of a material of the quantum dot light-emitting layer 6. An energy level of a valence band maximum (VBM) of the active layer 4 of the P-type semi-conductor material is approximately ranges from −5.3 eV to −6.2 eV.

Figure 5A:
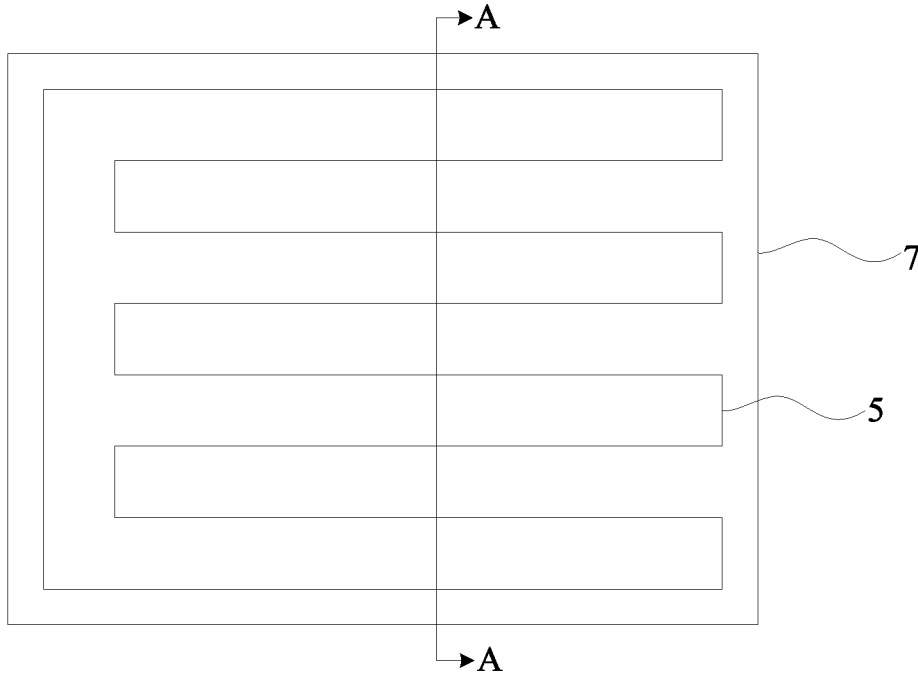
FIGS. 5A-5C are schematic top views of light-emitting
transistors according to some embodiments of the present
disclosure.
Figure 5B:
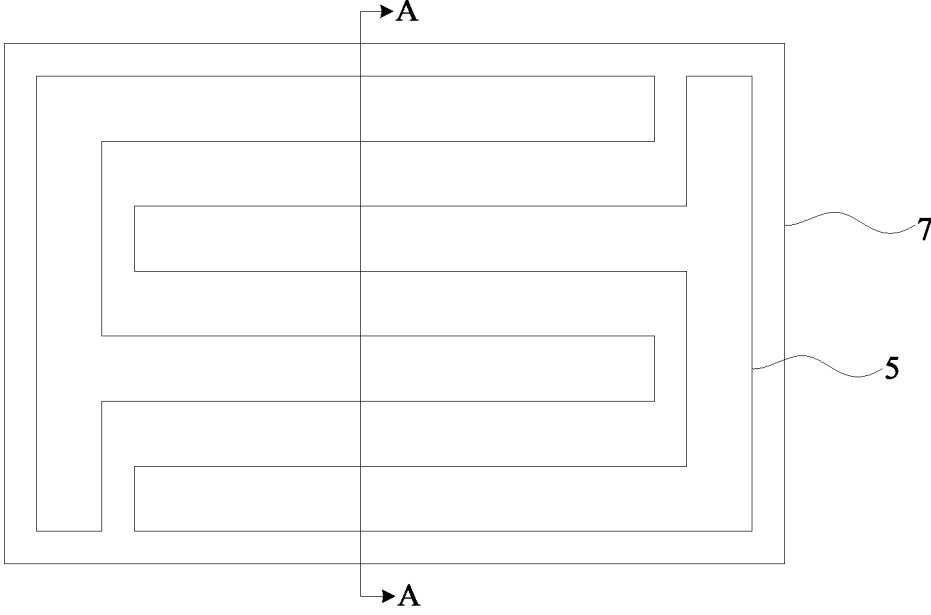
Figure 5C:
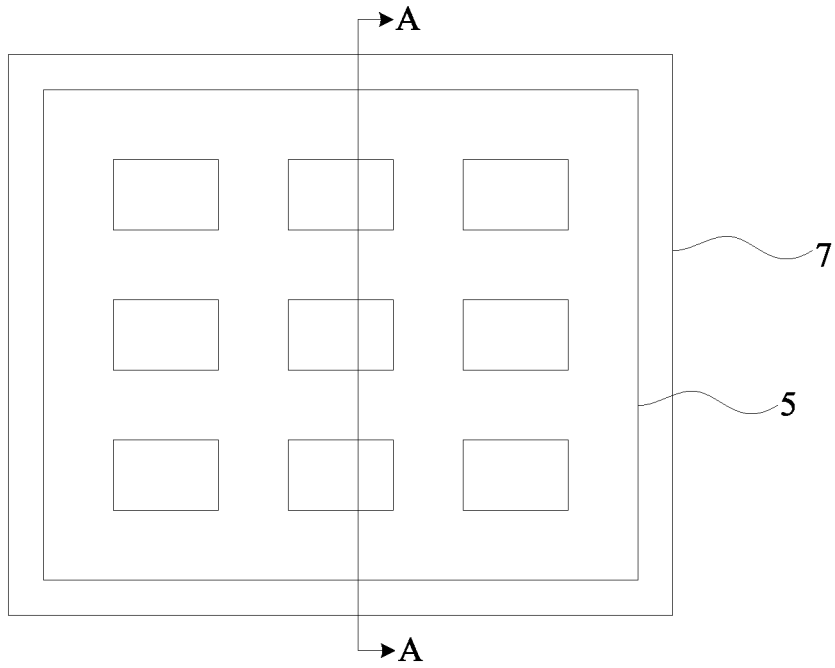

Specifically, in the light-emitting transistor provided in some embodiments of the present disclosure, the first elec-trodes 5 are located on the active layer 4. Optionally, the set pattern of the first electrode 5 may be a comb pattern as shown in FIG. 5A or a grid pattern as shown in FIG. 5C, etc. The number of the comb patterns may be two, and the comb patterns may be staggered to form an interdigitated structure as shown in FIG. 5B. It is noted that FIGS. 1-4 may be considered as sectional views along lines AA in FIGS. 5A-5C.

Specifically, in the light-emitting transistor provided in some embodiments of the present disclosure, the first elec-trodes 5 are set to have set patterns and may expose the underlying active layer 4, so that the quantum dot light-emitting layer 6 is in direct contact with both the first electrode 5 and the active layer 4. The quantum dot light-emitting layer 6 covers a surface and a side surface, facing away from the active layer 4, of the set pattern of the first electrode 5; and the quantum dot light-emitting layer 6 covers a surface of the active layer 4 not covered by the first electrodes 5. In this way, the quantum dot light-emitting layer 6 on the first electrodes 5 is in direct contact with the active layer 4, so that the active layer 4 serves as an electron transport layer to transfer electrons to the quantum dot light-emitting layer 6 after being energized, and then the electrons and holes transferred from the second electrode 7 to the quantum dot light-emitting layer 6 are recombined to generate exciton for emitting light; or, the active layer 4 serves as a hole transport layer to transfer holes to the quantum dot light-emitting layer 6 after being energized, and the holes and electrons transferred from the second electrode 7 to the quantum dot light-emitting layer 6 are recombined to generate exciton for emitting light.

Specifically, in the light-emitting transistor provided in some embodiments of the present disclosure, the second electrode 7 is located on the quantum dot light-emitting layer 6. Optionally, as shown in FIGS. 5A-5C, the second electrode 7 is arranged on an entire surface generally, and an orthographic projection of the second electrode 7 on the substrate 1 completely covers orthographic projections of the first electrodes 5 on the substrate 1 generally, so as to expand a light-emitting area.

Specifically, in the light-emitting transistor provided in some embodiments of the present disclosure, the first electrode 5 and the second electrode 7 may be formed of a single material layer or a composite material layer including at least one material of aluminum (Al), platinum (Pt), palladium (Pd), silver (Ag), magnesium (Mg), gold (Au), nickel (Ni), neodymium (Nd), chromium (Cr), lithium (Li), calcium (Ca), molybdenum (Mo), titanium (Ti), tungsten (W), and copper (Cu), or other suitable alloy in consideration of conductivity.

Optionally, in the light-emitting transistor provided in some embodiments of the present disclosure, as shown in FIGS. 1 and 3, when the active layer 4 includes an N-type semiconductor material, and the active layer and the electron transport layer have an integral structure, at least one of a hole injection layer 81 or a hole transport layer 82 may further be arranged between the quantum dot light-emitting layer 6 and the second electrode 7. FIGS. 1 and 3 show a case where both the hole injection layer 81 and the hole transport layer 82 are present. The material of the hole transport layer 82 may be poly[(9,9-dioctylfluorenyl-2,7-diyl)-co-(4,4'-(N-(4-sec-butylphenyl)diphenylamine)] (TFB), N,N'-Di-[(1-naphthalenyl)-N,N'-diphenyl]-1,1'-biphenyl)-4,4'-diamine (NPB), N,N'-bis(3-methylphenyl)-N,N'-diphenyl-benzidine (TPD) or poly(3,4-ethylenedioxythiophene):poly(styrenesulfonate) (PEDOT:PSS). Certainly, the material of the above film layer is not limited thereto.

Optionally, in the light-emitting transistor provided in some embodiments of the present disclosure, as shown in FIGS. 2 and 4, when the active layer 4 includes a P-type semiconductor material, and the active layer and the hole transport layer have an integral structure, at least one of an electron injection layer 91 or an electron transport layer 92 may further be arranged between the quantum dot light-emitting layer 6 and the second electrode 7. FIGS. 2 and 4 show a case where both the electron injection layer 91 and the electron transport layer 92 are present. The material of the electron transport layer 92 may be Alq3, 2-(4-biphenyl)-5-(4-tert-butylphenyl)-1,3,4-oxadiazole (PBD), 3,4,9,10-perylenetetracarboxylic diimide (PTCDI) or 1,3,5-Tris(1-phenyl-1H-benzimidazol-2-yl)benzene (TPBi). The material of the electron injection layer 91 may be an alkali metal fluoride, etc. Certainly, the material of the above film layer is not limited thereto.

A working principle of the light-emitting transistor provided in some embodiments of the present disclosure is described below with reference to FIGS. 3 and 4.

When the active layer 4 of the light-emitting transistor includes an N-type semiconductor material, as shown in FIG. 3, a positive voltage signal V3, such as +5V, is applied to the gate 2; the first power source signal end V1 connected to the first electrodes 5 is grounded; and another positive voltage signal such as +8V, is applied to the second power source signal end V2 connected to the second electrode 7. A large number of electrons are induced in the active layer 4 under the action of an electric field between the gate 2 and the first electrode 5. At the same time, under the action of an electric field between the second electrode 7 and the first electrode 5, holes are gradually injected into the hole injection layer 81 from the second electrode 7 and enter the quantum dot light-emitting layer 6 via the hole transport layer 82. The electrons are also injected into the quantum dot light-emitting layer 6 under the action of the electric field between the second electrode 7 and the first electrode 5, and under the action of an electric field between the second electrode 7 and the gate 2, to achieve light emission of the light-emitting transistor. The light emission of the light-emitting transistor may be controlled by a signal voltage of V3 applied to the gate 2 and a signal voltage of a V2 applied to the second electrode 7.

When the active layer 4 of the light-emitting transistor includes a P-type semiconductor material, as shown in FIG. 4, a negative voltage signal V3 such as −5V, is applied to the gate 2; the first power source signal end V1 connected to the first electrodes 5 is grounded; and another negative voltage signal such as −8V, is applied to the second power source signal end V2 connected to the second electrode 7. A large number of holes are induced in the active layer 4 under the action of the electric field between the gate 2 and the first electrode 5. At the same time, under the action of the electric field between the second electrode 7 and the first electrode 5, electrons are gradually injected into the electron injection layer 91 from the second electrode 7 and enter the quantum dot light-emitting layer 6 via the electron transport layer 92. The holes are also injected into the quantum dot light-emitting layer 6 under the action of the electric field between the second electrode 7 and the first electrode 5, and under the action of the electric field between the second electrode 7 and the gate 2, to achieve light emission of the light-emitting transistor. The light emission of the light-emitting transistor may be controlled by the signal voltage of V3 applied to the gate 2 and the signal voltage of V2 applied to the second electrode 7.

Figure 6:
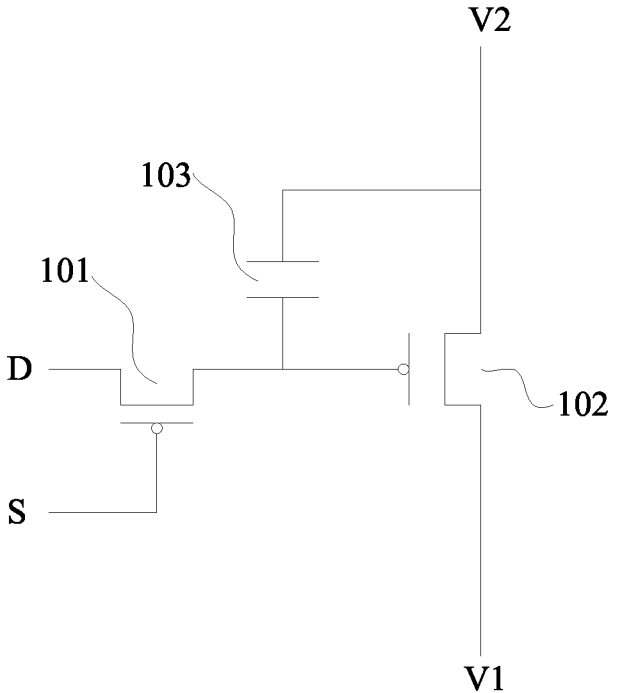
FIG. 6 is a schematic diagram of a circuit structure of a
pixel circuit in a display substrate according to some
embodiments of the present disclosure.
Figure 7:
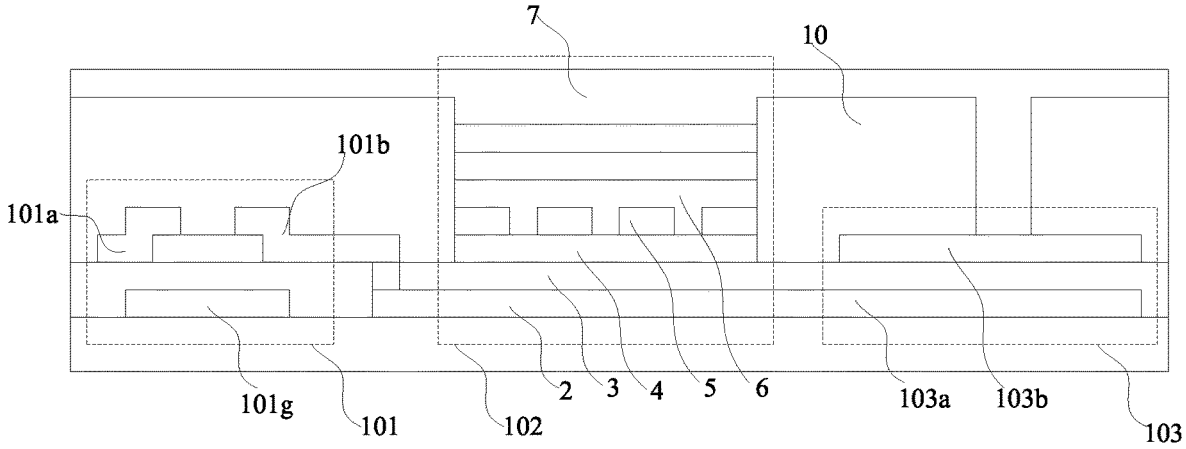
FIG. 7 is a schematic structural diagram of a display
substrate according to some embodiments of the present
disclosure.

Based on the same inventive concept, an embodiment of the present disclosure further provides a display substrate, including a plurality of pixel circuits; and each of the plurality of pixel circuits as shown in FIGS. 6 and 7 includes:

a switch transistor 101, where a gate 101g of the switch transistor 101 is coupled to a scanning signal end S, and a first electrode 101a of the switch transistor 101 is coupled to a data signal end D;

the light-emitting transistor 102 provided in the embodiment of the present disclosure, where a gate 2 of the light-emitting transistor 102 is coupled to a second electrode 101b of the switch transistor 101, a first electrode 5 of the light-emitting transistor 102 is coupled to a first power source signal end V1, and a second electrode 7 of the light-emitting transistor 102 is coupled to a second power source signal end V2; and a capacitor 103, where the capacitor 103 is coupled between the first electrode 5 and the gate 2 of the light-emitting transistor 102.

Figure 11:
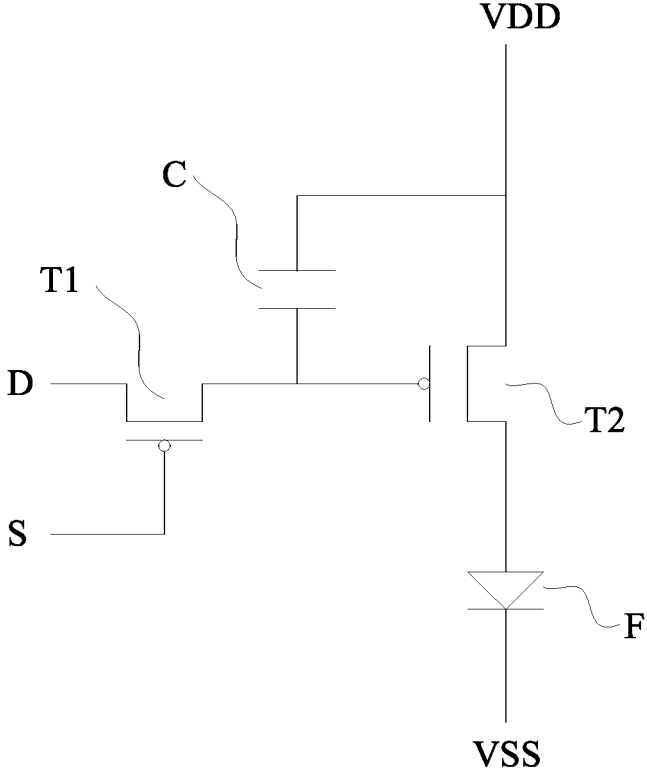
FIG. 11 is a schematic diagram of a circuit structure of a
pixel circuit in a display substrate according to the related
art.

Specifically, in the display substrate provided in some embodiments of the present disclosure, the pixel circuit adopts the light-emitting transistor 102 provided in some embodiments of the present disclosure, and the light-emitting transistor 102 integrates a control transistor and a quantum dot light-emitting device in the same device. When the light-emitting transistor is applied to the pixel circuit, a circuit structure may be simplified, that is, compared with a pixel circuit provided in the relevant art as shown in FIG. 11, one transistor may be saved, an area occupied by the device may be effectively reduced, and an aperture ratio of the device may be improved.

Optionally, in the display substrate provided in some embodiments of the present disclosure, as shown in FIG. 7, the gate 101g of the switch transistor 101, the gate 2 of the light-emitting transistor 102, and a first electrode 103a of the capacitor 103 may be arranged on the same layer; the first electrode 101a and the second electrode 101b of the switch transistor 101, the first electrode 5 of the light-emitting transistor 102, and a second electrode 103b of the capacitor 103 may be arranged on the same layer, to simplify a film structure in the display substrate; and the second electrode 7 of the light-emitting transistor 102 is electrically connected to the second electrode 103b of the capacitor 103, specifi-cally, the second electrode of the light-emitting transistor may be electrically connected to the second electrode of the capacitor through a via hole penetrating a pixel defining layer 10.

Optionally, in the display substrate provided in some embodiments of the present disclosure, the first power source signal end V1 is grounded generally to fix a potential.

Optionally, in the display substrate provided in some embodiments of the present disclosure, an active layer 4 of the light-emitting transistor 102 may include an N-type semiconductor material, and in this case, the second power source signal end V2 is configured to load a positive voltage signal. Generally, in order to simplify a fabrication process and a substrate film structure, the active layer of the switch transistor 101 and the active layer 4 of the light-emitting transistor are fabricated on the same layer by using the same material. In this way, when the scanning signal end S is loaded with a positive voltage signal such as +5V, the switch transistor 101 is switched on, the data signal end D is also loaded with a positive voltage signal V3 such as +5V, and the V3 signal is transmitted to the gate 2 of the light-emitting transistor 102. That is, a voltage of about +5V is applied to the gate 2 of the light-emitting transistor 102. Under the action of the gate voltage, a large number of electrons are induced in the active layer 4 of the light-emitting transistor 102. At the same time, under the action of the electric field between the second electrode 7 and the first electrode 5 of the light-emitting transistor 102, holes enter the quantum dot light-emitting layer 6 from the second electrode 7 gradually, and electrons are also injected into the quantum dot light-emitting layer 6 under the action of the electric field between the second electrode 7 and the first electrode 5 and under the action of the electric field between the second electrode 7 and the gate 2, to achieve light emission of the light-emitting transistor 102. The light emission of the light-emitting transistor 102 may be controlled by the signal voltage (related to the voltage provided by the data signal end D) applied to the gate 2 and the signal voltage of V2 applied to the second electrode 7.

Optionally, in the display substrate provided in some embodiments of the present disclosure, the active layer 4 of the light-emitting transistor 102 may include a P-type semi-conductor material. In this case, the second power source signal end V2 is configured to load a negative voltage signal. Generally, in order to simplify a fabrication process and a substrate film structure, the active layer of the switch tran-sistor 101 and the active layer 4 of the light-emitting transistor are fabricated on the same layer by using the same material. In this way, when the scanning signal end S is loaded with a negative voltage signal such as −5V, the switch transistor 101 is switched on, the data signal end D is also loaded with a negative voltage signal V3 such as −5V, and the V3 signal is transmitted to the gate 2 of the light-emitting transistor 102. That is, a voltage of about −5V is applied to the gate 2 of the light-emitting transistor 102. Under the action of the gate voltage, a large number of holes are induced in the active layer 4 of the light-emitting transistor 102. At the same time, under the action of the electric field between the second electrode 7 and the first electrode 5 of the light-emitting transistor 102, electrons enter the quantum dot light-emitting layer 6 from the second electrode 7 gradually, and holes are also injected into the quantum dot light-emitting layer 6 under the action of the electric field between the second electrode 7 and the first electrode 5 and under the action of the electric field between the second electrode 7 and the gate 2, to achieve light emission of the light-emitting transistor 102. The light emission of the light-emitting transistor 102 may be controlled by the signal voltage (related to the voltage provided by the data signal end D) applied to the gate 2 and the signal voltage of V2 applied to the second electrode 7.

Figure 8:
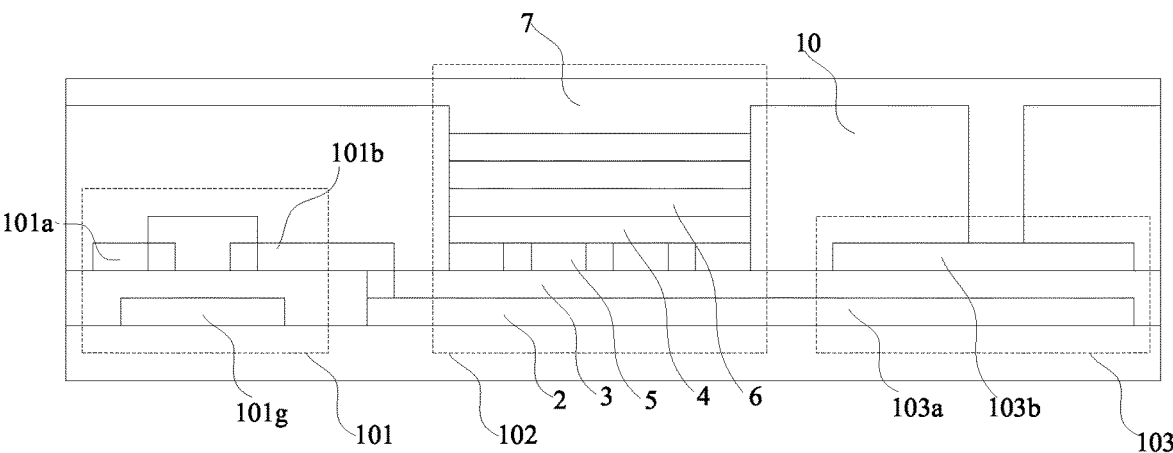
FIG. 8 is another schematic structural diagram of a
display substrate according to some embodiments of the
present disclosure.

Based on the same inventive concept, an embodiment of the present disclosure further provides another display sub-strate, including a plurality of pixel circuits, and each of the plurality of pixel circuits as shown in FIGS. 6 and 8 includes:

a switch transistor 101, where a gate 101g of the switch transistor 101 is coupled to a scanning signal end S, and a first electrode 101a of the switch transistor 101 is coupled to a data signal end D;

a light-emitting transistor 102 including a gate 2, an insulating layer 3, first electrodes 5, an active layer 4, a quantum dot light-emitting layer 6 and a second electrode 7 that are sequentially stacked; where the first electrodes 5 have set patterns, and the active layer 4 is filled between the set patterns of the first electrodes 5 and comes into contact with the insulating layer 3; and the gate 2 of the light-emitting transistor 102 is coupled to a second electrode 101b of the switch transistor 101, the first electrode 5 of the light-emitting transistor 102 is coupled to a first power source signal end V1, and the second electrode 7 of the light-emitting transistor 102 is coupled to a second power source signal end V2; and a capacitor 103, where the capacitor 103 is coupled between the first electrode 5 and the gate 2 of the light-emitting transistor 102.

Specifically, in the display substrate provided in some embodiments of the present disclosure, the pixel circuit adopts a light-emitting transistor 102 that integrates a con-trol transistor and a quantum dot light-emitting device in the same device, to simultaneously achieve functions of switch control and light-emitting display. When the light-emitting transistor is applied to the pixel circuit, the circuit structure may be simplified, that is, compared with a pixel circuit provided in the relevant art as shown in FIG. 11, one transistor may be saved, the area occupied by the device may be effectively reduced, and the aperture ratio of the device may be improved.

Specifically, in the display substrate provided in some embodiments of the present disclosure, the first electrodes 5 of the light-emitting transistor 102 are set to have set patterns and may expose the underlying insulating layer 3, so that that the active layer 4 is in direct contact with both the first electrode 5 and the insulating layer 3. The active layer 4 covers a surface and a side surface, facing away from the insulating layer 3, of the set pattern of the first electrode 5; and the active layer 4 covers a surface of the insulating layer 3 not covered by the first electrode 5. In this way, the active layer 4 located on the first electrode 5 is in direct contact with the insulating layer 3, so that the insulating layer 3 induces electrons after being energized, the active layer 4 serves as an electron transport layer to transfer the electrons to the quantum dot light-emitting layer 6, and then the electrons and holes transferred from the second electrode 7 to the quantum dot light-emitting layer 6 are recombined to generate exciton for emitting light; or, the insulating layer 3 induces holes after being energized, the active layer 4 serves as a hole transport layer to transfer holes to the quantum dot light-emitting layer 6, and the holes and electrons transferred from the second electrode 7 to the quantum dot light-emitting layer 6 are recombined to generate exciton for emitting light.

Optionally, in the display substrate provided in some embodiments of the present disclosure, the set pattern of the first electrode 5 of the light-emitting transistor 102 may be a comb pattern as shown in FIG. 5A or a grid pattern as shown in FIG. 5C. The number of the comb patterns may be two, and the comb patterns may be staggered to form an interdigitated structure as shown in FIG. 5B.

Optionally, in the display substrate provided in some embodiments of the present disclosure, as shown in FIGS. 5A-5C, the second electrode 7 of the light-emitting transistor 102 may be arranged on an entire surface, and an orthographic projection of the second electrode 7 of the light-emitting transistor 102 on the substrate 1 completely covers orthographic projections of the first electrodes 5 of the light-emitting transistor 102 on the substrate 1, to expand a light-emitting area.

Optionally, in the display substrate provided in some embodiments of the present disclosure, the gate 101g of the switch transistor 101, the gate 2 of the light-emitting transistor 102, and a first electrode 103a of the capacitor 103 may be arranged on the same layer; and the first electrode 101a and the second electrode 101b of the switch transistor 101, the first electrode 5 of the light-emitting transistor 102, and a second electrode 103b of the capacitor 103 may be arranged on the same layer, to simplify a film structure in the display substrate. The second electrode 7 of the light-emitting transistor 102 is electrically connected to the second electrode 103b of the capacitor 103, specifically, the second electrode of the light-emitting transistor may be electrically connected to the second electrode of the capacitor through a via hole penetrating a pixel defining layer 10.

Figure 9:
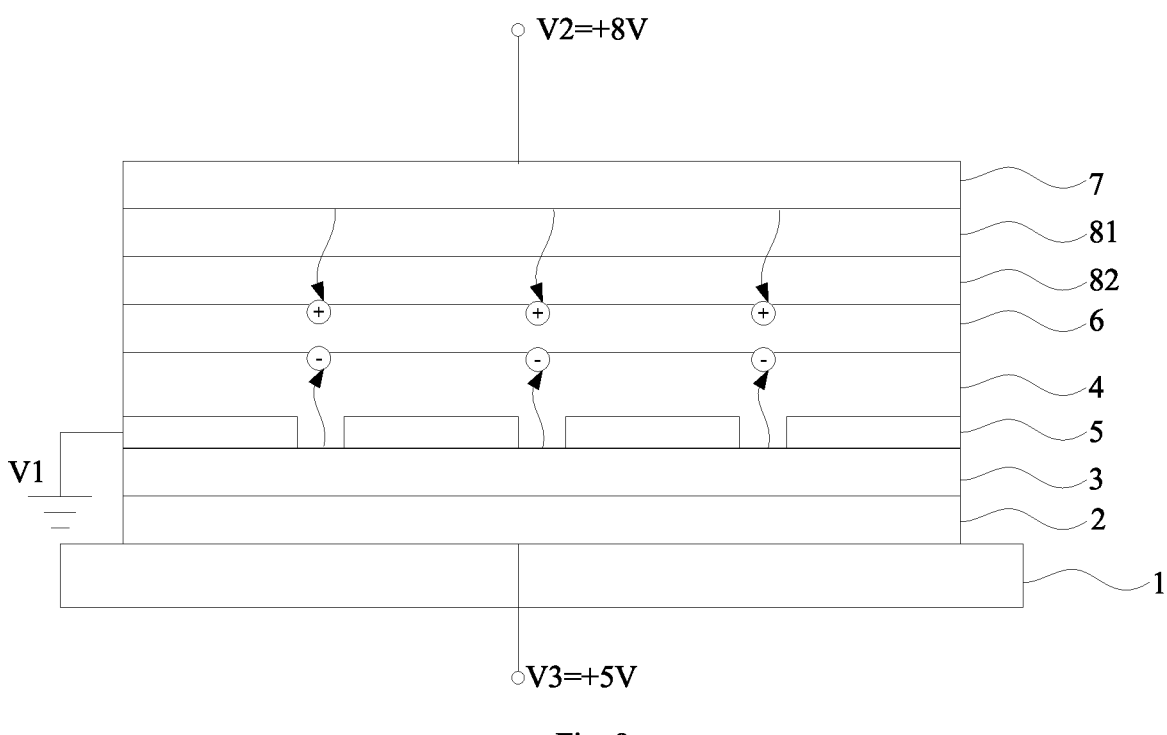
FIG. 9 is a schematic diagram of another principle of a
light-emitting transistor according to some embodiments of
the present disclosure.

Optionally, in the display substrate provided in some embodiments of the present disclosure, as shown in FIG. 9, the active layer 4 of the light-emitting transistor 102 may include an N-type semiconductor material. In this case, the light-emitting transistor 102 may further include an electron transport layer; and the active layer 4 of the light-emitting transistor 102 also serves as the electron transport layer, that is, the electron transport layer and the active layer have an integral structure. Moreover, an energy level of the selected N-type semiconductor material needs to match an energy level of a material of the quantum dot light-emitting layer 6. An energy level of a CBM of the active layer 4 of the N-type semiconductor material is approximately ranges from −3.8 eV to −4.2 eV. Generally, in order to simplify a fabrication process and a substrate film structure, the active layer of the switch transistor 101 and the active layer 4 of the light-emitting transistor are fabricated on the same layer by using the same material.

Optionally, in the display substrate provided in some embodiment of the present disclosure, when the active layer 4 and the electron transport layer of the light-emitting transistor 102 have an integral structure, as shown in FIG. 9, the first power source signal end V1 is grounded generally, and the second power source signal end V2 is configured to load a positive voltage signal. In this way, when the scanning signal end S is loaded with a positive voltage signal such as +5V, the switch transistor 101 is switched on, the data signal end D is also loaded with a positive voltage signal V3 such as +5V, and the V3 signal is transmitted to the gate 2 of the light-emitting transistor 102. That is, a voltage of about +5V is applied to the gate 2 of the light-emitting transistor 102. Under the action of the gate voltage, a large number of electrons are induced at a side, close to the active layer 4, of the insulating layer 3 of the light-emitting transistor 102. At the same time, under the action of the electric field between the second electrode 7 and the first electrode 5 of the light-emitting transistor 102, holes enter the quantum dot light-emitting layer 6 from the second electrode 7 gradually, and electrons are also injected into the quantum dot light-emitting layer 6 via the active layer 4 under the action of the electric field between the second electrode 7 and the first electrode 5 and under the action of the electric field between the second electrode 7 and the gate 2, to achieve light emission of the light-emitting transistor 102. The light emission of the light-emitting transistor 102 may be controlled by the signal voltage (related to the voltage provided by the data signal end D) applied to the gate 2 and the signal voltage of V2 applied to the second electrode 7.

Optionally, in the display substrate provided in some embodiments of the present disclosure, when the active layer 4 and the electron transport layer of the light-emitting transistor 102 have an integral structure, as shown in FIG. 9, the light-emitting transistor 102 may further include at least one of a hole injection layer 81 or a hole transport layer 82 between the quantum dot light-emitting layer 6 and the second electrode 7 of the light-emitting transistor 102. FIG. 9 shows a case where both the hole injection layer 81 and the hole transport layer 82 are present.

Figure 10:
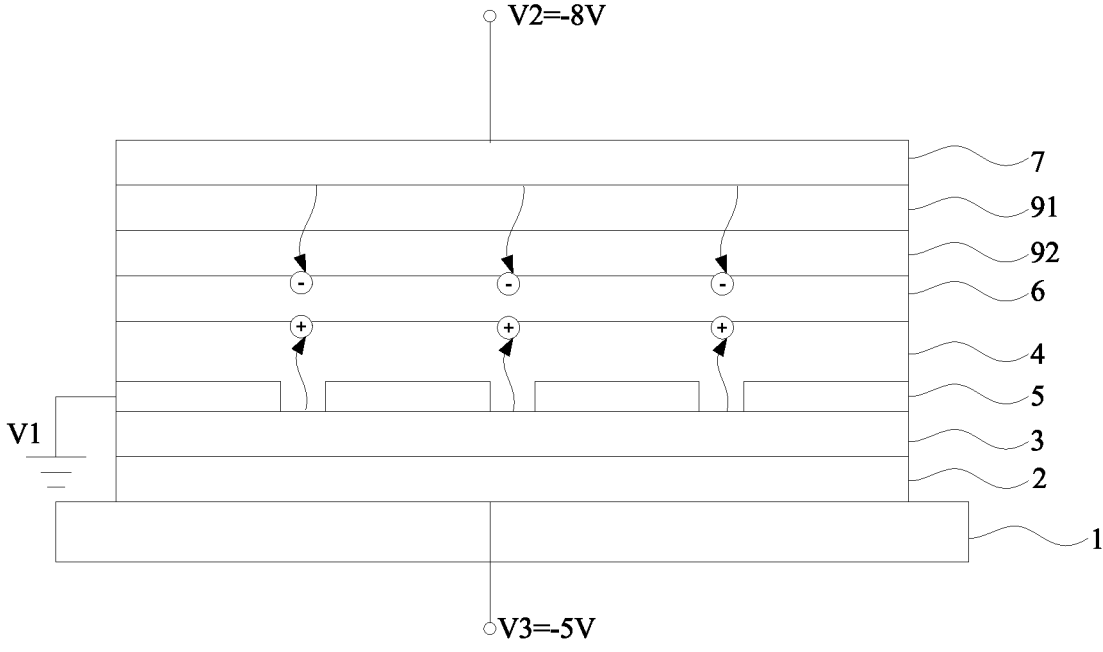
FIG. 10 is a schematic diagram of another principle of a
light-emitting transistor according to some embodiments of
the present disclosure.

Optionally, in the display substrate provided in some embodiments of the present disclosure, as shown in FIG. 10, the active layer 4 of the light-emitting transistor 102 may include a P-type semiconductor material. In this case, the light-emitting transistor 102 may further include a hole transport layer; and the active layer 4 of the light-emitting transistor 102 also serves as the hole transport layer, that is, the hole transport layer and the active layer have an integrated structure. Moreover, an energy level of the selected P-type semiconductor material needs to match an energy level of a material of the quantum dot light-emitting layer 6. An energy level of a VBM of the active layer 4 of the P-type semiconductor material is approximately ranges from −5.3 eV to −6.2 eV. Generally, in order to simplify a fabrication process and a substrate film structure, the active layer of the switch transistor 101 and the active layer 4 of the light-emitting transistor are fabricated on the same layer by using the same material.

Optionally, in the display substrate provided in some embodiments of the present disclosure, when the active layer 4 and the hole transport layer of the light-emitting transistor 102 have an integral structure, as shown in FIG. 10, the first power source signal end V1 is grounded, and the second power source signal end V2 is configured to load a negative voltage signal. In this way, when the scanning signal end S is loaded with a negative voltage signal such as −5V, the switch transistor 101 is switched on, the data signal end D is also loaded with a negative voltage signal V3 such as −5V, and the V3 signal is transmitted to the gate 2 of the light-emitting transistor 102. That is, a voltage of about −5V is applied to the gate 2 of the light-emitting transistor 102. Under the action of the gate voltage, a large number of holes are induced at a side, close to the active layer 4, of the insulating layer 3 of the light-emitting transistor 102. At the same time, under the action of the electric field between the second electrode 7 and the first electrode 5 of the light-emitting transistor 102, electrons enter the quantum dot light-emitting layer 6 from the second electrode 7 gradually, and holes are also injected into the quantum dot light-emitting layer 6 via the active layer 4 under the action of the electric field between the second electrode 7 and the first electrode 5 and under the action of the electric field between the second electrode 7 and the gate 2, to achieve light emission of the light-emitting transistor 102. The light emission of the light-emitting transistor 102 may be controlled by the signal voltage (related to the voltage provided by the data signal end D) applied to the gate 2 and the signal voltage of V2 applied to the second electrode 7.

Optionally, in the display substrate provided in some embodiments of the present disclosure, when the active layer 4 and the hole transport layer of the light-emitting transistor 102 have an integral structure, as shown in FIG. 10, the light-emitting transistor 102 may further include at least one of an electron injection layer 91 or an electron transport layer 92 between the quantum dot light-emitting layer 6 and the second electrode 7 of the light-emitting transistor 102. FIG. 10 shows a case where both the electron injection layer 91 and the electron transport layer 92 are present.

Optionally, in the display substrates provided in some embodiments of the present disclosure, the display substrates may be any conventional display product with a display function, such as a mobile phone, a tablet computer, a television, a display, a notebook computer, a digital photo frame and a navigator.

Apparently, those skilled in the art can make various amendments and variations to the present disclosure without departing from the spirit and scope of the present disclosure. In this way, if modifications and variations to the present disclosure fall within the scope of the claims of the present disclosure and their equivalents, it is intended that the present disclosure also encompass these amendments and variations.

What is claimed is:

1. A light-emitting transistor, comprising:
   a substrate;
   a gate on the substrate;
   an insulating layer on a side, facing away from the substrate, of the gate;
   an active layer on a side, facing away from the gate, of the insulating layer;
   first electrodes on a side, facing away from the insulating layer, of the active layer, wherein the first electrodes have set patterns;
   a quantum dot light-emitting layer on a side, facing away from the active layer, of the first electrodes; wherein the quantum dot light-emitting layer is filled between the set patterns of the first electrodes and comes into contact with the active layer; wherein the quantum dot light-emitting layer covers a surface and a side surface, facing away from the active layer, of the set pattern of the first electrode; and the quantum dot light-emitting layer covers a surface of the active layer not covered by the first electrodes; and
   a second electrode on a side, facing away from the first electrode, of the quantum dot light-emitting layer.

2. The light-emitting transistor according to claim 1, wherein the set patterns of the first electrodes are comb patterns or grid patterns.

3. The light-emitting transistor according to claim 1, wherein the second electrode is arranged on an entire surface; and
   an orthographic projection of the second electrode on the substrate completely covers orthographic projections of the first electrodes on the substrate.

4. The light-emitting transistor according to claim 1, further comprising an electron transport layer;

wherein the active layer comprises an N-type semiconductor material, and the electron transport layer and the active layer have an integral structure;
wherein the light-emitting transistor further comprises at least one of a hole injection layer or a hole transport layer between the quantum dot light-emitting layer and the second electrode.

5. The light-emitting transistor according to claim 1, further comprising a hole transport layer;
   wherein the active layer comprises a P-type semiconductor material, and the hole transport layer and the active layer have an integral structure.

6. The light-emitting transistor according to claim 5, further comprising at least one of an electron injection layer or an electron transport layer between the quantum dot light-emitting layer and the second electrode.

7. A display substrate, comprising a plurality of pixel circuits, wherein each of the plurality of pixel circuits comprises:
   a switch transistor, wherein a gate of the switch transistor is coupled to a scanning signal end, and a first electrode of the switch transistor is coupled to a data signal end;
   the light-emitting transistor according to claim 1, wherein the gate of the light-emitting transistor is coupled to a second electrode of the switch transistor, the first electrode of the light-emitting transistor is coupled to a first power source signal end, and the second electrode of the light-emitting transistor is coupled to a second power source signal end; and
   a capacitor, wherein the capacitor is coupled between the first electrode and the gate of the light-emitting transistor.

8. The display substrate according to claim 7, wherein the first power source signal end is grounded.

9. The display substrate according to claim 8, wherein the active layer of the light-emitting transistor comprises an N-type semiconductor material, and the second power source signal end is configured to load a positive voltage signal.

10. The display substrate according to claim 8, wherein the active layer of the light-emitting transistor comprises a P-type semiconductor material, and the second power source signal end is configured to load a negative voltage signal.

11. A display substrate, comprising a plurality of pixel circuits, wherein each of the plurality of pixel circuits comprises:
    a switch transistor, wherein a gate of the switch transistor is coupled to a scanning signal end, and a first electrode of the switch transistor is coupled to a data signal end;
    a light-emitting transistor comprising a gate, an insulating layer, first electrodes, an active layer, a quantum dot light-emitting layer and a second electrode that are sequentially stacked; wherein the first electrodes have set patterns, and the active layer is filled between the set patterns of the first electrodes and comes into contact with the insulating layer; wherein the active layer covers a surface and a side surface, facing away from the insulating layer, of the set pattern of the first electrode; the active layer covers a surface of the insulating layer not covered by the first electrodes; and the gate of the light-emitting transistor is coupled to a second electrode of the switch transistor, the first electrode of the light-emitting transistor is coupled to a first power source signal end, and the second electrode of the light-emitting transistor is coupled to a second power source signal end; and a capacitor, wherein the capacitor is coupled between the first electrode and the gate of the light-emitting transistor.

12. The display substrate according to claim 11, wherein the set pattern of the first electrode of the light-emitting transistor is a comb pattern or a grid pattern.

13. The display substrate according to claim 11, wherein the second electrode of the light-emitting transistor is arranged on an entire surface; and an orthographic projection of the second electrode of the light-emitting transistor on the substrate completely covers orthographic projections of the first electrodes of the light-emitting transistor on the substrate.

14. The display substrate according to claim 11, wherein the gate of the switch transistor, the gate of the light-emitting transistor, and a first electrode of the capacitor are arranged on a same layer;

the first electrode and the second electrode of the switch transistor, the first electrodes of the light-emitting transistor and a second electrode of the capacitor are arranged on a same layer; and the second electrode of the light-emitting transistor is electrically connected to the second electrode of the capacitor.

15. The display substrate according to claim 11, wherein the light-emitting transistor further comprises an electron transport layer;

the active layer of the light-emitting transistor comprises an N-type semiconductor material; and the electron transport layer and the active layer of the light-emitting transistor have an integral structure.

16. The display substrate according to claim 15, wherein the first power source signal end is grounded, and the second power source signal end is configured to load a positive voltage signal.

17. The display substrate according to claim 15, wherein the light-emitting transistor further comprises at least one of a hole injection layer or a hole transport layer between the quantum dot light-emitting layer and the second electrode of the light-emitting transistor.

18. The display substrate according to claim 11, wherein the light-emitting transistor further comprises a hole transport layer;

the active layer of the light-emitting transistor comprises a P-type semiconductor material; and the hole transport layer and the active layer of the light-emitting transistor have an integral structure.

19. The display substrate according to claim 18, wherein the first power source signal end is grounded, and the second power source signal end is configured to load a negative voltage signal.

20. The display substrate according to claim 18, wherein the light-emitting transistor further comprises at least one of an electron injection layer or an electron transport layer between the quantum dot light-emitting layer and the second electrode of the light-emitting transistor.

* * * * *